US012784861B2

(12) United States Patent
Kim et al.

(10) Patent No.: US 12,784,861 B2
(45) Date of Patent: Nov. 3, 2026

(54) SEMICONDUCTOR APPARATUS HAVING TEST FUNCTION AND SEMICONDUCTOR SYSTEM INCLUDING THE SAME

(71) Applicant: SK hynix Inc., Icheon-si (KR)

(72) Inventors: Hyun Seung Kim, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 204 days.

(21) Appl. No.: 18/619,671

(22) Filed: Mar. 28, 2024

(65) Prior Publication Data

US 2025/0061959 A1 Feb. 20, 2025

(30) Foreign Application Priority Data

Aug. 17, 2023 (KR) ........................ 10-2023-0107636

(51) Int. Cl.
*G11C 29/44* (2006.01)

(52) U.S. Cl.
CPC .................................... *G11C 29/44* (2013.01)

(58) Field of Classification Search
None
See application file for complete search history.

(56) References Cited

U.S. PATENT DOCUMENTS 8,024,627 B2 9/2011 Song
2007/0234120 A1 10/2007 Yoshida et al.
2016/0300625 A1* 10/2016 Kim ....................... G11C 29/38
2017/0140840 A1* 5/2017 Shin ....................... G11C 29/14
2021/0279129 A1* 9/2021 Lee ........................ G11C 29/42

* cited by examiner

*Primary Examiner* — Mark D Featherstone
(74) *Attorney, Agent, or Firm* — WILLIAM PARK AND ASSOCIATES LTD.

(57) ABSTRACT

A semiconductor apparatus includes a data alignment circuit and a data pattern control circuit. The data alignment circuit aligns data input through each of a plurality of data input/output pads to generate a plurality of alignment data. The data pattern control circuit generates a plurality of preliminary write data by copying some bits of a first alignment data among the plurality of alignment data to a plurality of input paths coupled to data input/output pads other than a first data input/output pad among the plurality of data input/output pads, and changes a pattern of the plurality of preliminary write data according to remaining bits of the first alignment data to generate a plurality of write data.

15 Claims, 6 Drawing Sheets

SEMICONDUCTOR APPARATUS HAVING TEST FUNCTION AND SEMICONDUCTOR SYSTEM INCLUDING THE SAME

CROSS-REFERENCES TO RELATED APPLICATION

The present application claims priority under 35 U.S.C. § 119(a) to Korean application number 10-2023-0107636 filed on Aug. 17, 2023, in the Korean Intellectual Property Office, which is incorporated herein by reference in its entirety as set forth in full.

BACKGROUND

1. Technical Field

Various embodiments generally relate to a semiconductor circuit, and, more particularly, to a semiconductor apparatus having a test function and a semiconductor system including the same.

2. Related Art

Semiconductor apparatuses can be tested by performing write and read operations in response to data and commands provided by a host, such as a test equipment, coupled to the semiconductor apparatuses.

To increase test yield, the test equipment should connect as many devices under test (DUTs), i.e., semiconductor apparatuses, as possible to perform tests simultaneously. Therefore, a limited number of data input/output pads are assigned to each of the DUTs. The smaller the number of data input/output pads allocated to each of the DUTs, the higher the test yield.

During a test process, number of data input/output pads that can be connected to each semiconductor device is limited. Thus, it is difficult to write a desired test pattern in input paths connected to all data input/output pads.

SUMMARY

In an embodiment, a semiconductor apparatus may comprise a data alignment circuit and a data pattern control circuit. The data alignment circuit may be configured to align data input through a plurality of data input/output pads, to generate alignment data. The data pattern control circuit may be configured to generate preliminary write data by copying bits of "a first alignment data" to a plurality of input paths, which are coupled to the plurality of data input/output pads, and which may be configured to change a pattern of the preliminary write data to generate a of write data.

In an embodiment, a semiconductor apparatus may comprise a data alignment circuit and a plurality of data pattern control units, which are also known herein as data pattern control circuits. The data alignment circuit may be configured to align data input through each data input/output pad of a plurality of data input/output pads, in order to generate a plurality of alignment data. Each data pattern control unit may be configured to generate preliminary write data by copying, in response to activation of a test mode signal, 0th to Mth burst bits of a first alignment data to a plurality of input paths coupled to the plurality of data input/output pads, one bit at a time Each data pattern control unit may be configured to invert a pattern of the preliminary write data according to (M+1)th to Nth burst bits of the first alignment data to generate a plurality of write data.

In an embodiment, a semiconductor system may comprise a host and a semiconductor apparatus. The host may be configured to output a first data including a test source data and a pattern control signal for determining whether to invert the test source data. The semiconductor apparatus may be configured to receive the first data through a first data input/output pad of a plurality of data input/output pads to generate a first alignment data, generate a plurality of write data and write them in a memory region based on the first alignment data responsive to the first alignment data and write the plurality of pieces of write data in a memory region, and may be configured to adjust a pattern of the write data during the generating of the plurality of write data.

DETAILED DESCRIPTION

Figure 1:
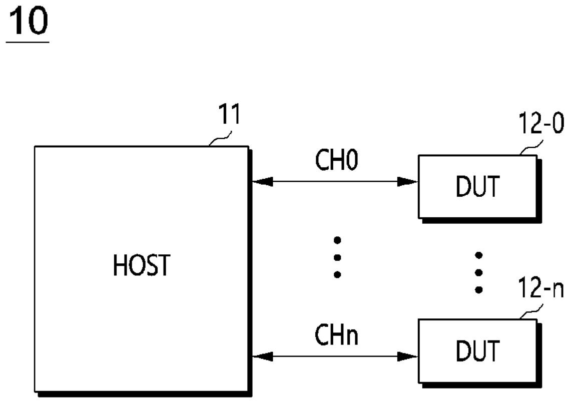
FIG. 1 is a diagram illustrating a configuration of a semiconductor system according to an embodiment.

Referring to FIG. 1, the semiconductor system 10 according to an embodiment may include a host 11 and a plurality of devices under test (DUTs) 12-0 to **12-*n***.

The host 11 may be, for example, a test equipment. The plurality of DUTs 12-0 to **12-*n*** may be semiconductor apparatuses, such as memory chips.

The plurality of DUTs may be coupled to the host 11 through a plurality of channels CH0 to CHn.

The host 11 may transmit commands, addresses and clock signals, and the like to one or both of the DUTs 12-0 to **12-*n* through one or both corresponding channels CH0 to CHn, in different embodiments such transmissions capable of being made simultaneously, sequentially or individually. The host 11 may thus selectively transmit data to and selectively receive data from one or both DUTs 12-0 to 12-*n* through corresponding channels CH0** to CHn.

The host 11, i.e., the test equipment, may include test source data and a pattern control signal for determining whether to or not invert the data source data in the data during the test operation and provide the data including the test source data and the pattern control signal one or both of the DUTs 12-0 to **12-*n***.

Each of DUTs 12-0 to **12-*n* may: receive data provided by the host 11** through any one of a plurality of data input/output pads to generate a first alignment data; generate write data according to the first alignment data; write, i.e., save or store the write data in a memory region; and adjust a pattern of the write data during a process of generating the write data.

Hereinafter, the operation or method of adjusting the pattern of the write data during the above-described process of generating the write data will be referred to as a "write operation with pattern adjustment." The detailed configuration and operation of a DUT, for example, a semiconductor apparatus, related to a write operation with pattern adjustment will be described in more detail with reference to the following drawings.

Figure 2:
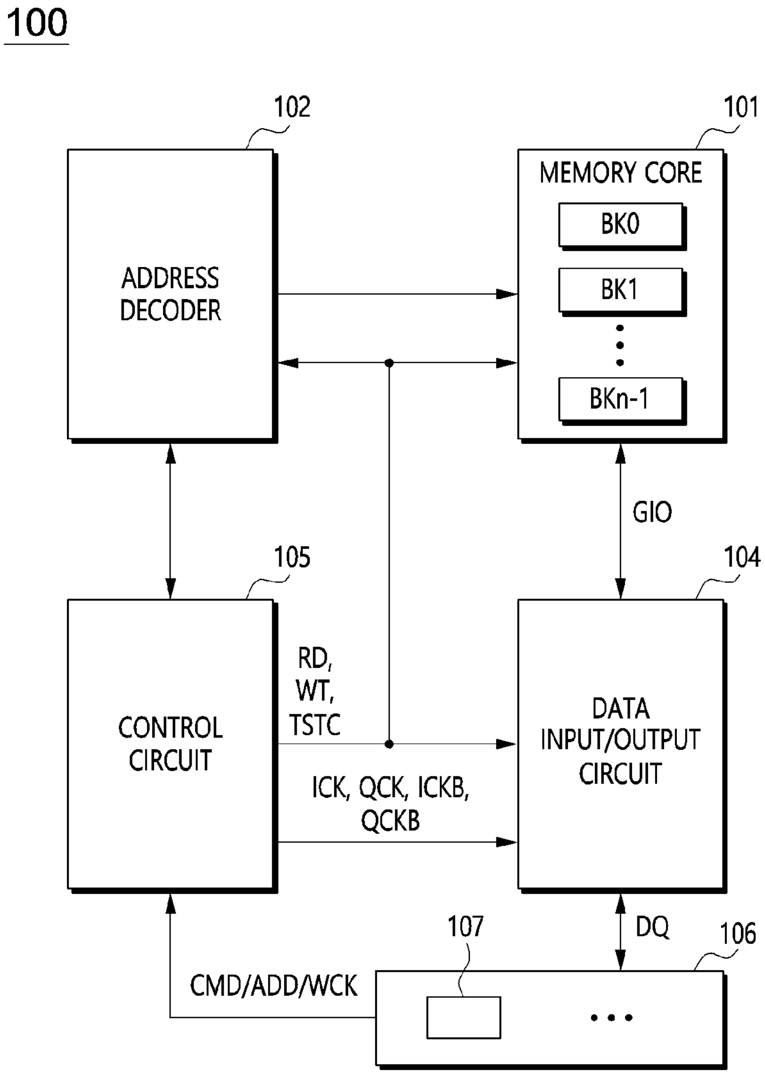
FIG. 2 is a diagram illustrating a configuration of a semiconductor apparatus according to an embodiment.

FIG. 2 illustrates an example of a semiconductor apparatus 100 according to an embodiment.

Referring to FIG. 2, the semiconductor apparatus 100 may comprise a memory core 101, an address decoder 102, a data input/output circuit 104, a control circuit 105, and an input/output pad unit 106.

The memory core 101 may comprise a plurality of memory cells, and the plurality of memory cells may comprise at least one of volatile memory and non-volatile memory. The volatile memory may comprise SRAM (Static RAM), DRAM (Dynamic RAM), SDRAM (Synchronous DRAM), and the non-volatile memory may comprise ROM (Read Only Memory), PROM (Programmable ROM), EEPROM (Electrically Erase and Programmable ROM), EPROM (Electrically Programmable ROM), flash memory, PRAM (Phase change RAM), MRAM (Magnetic RAM), RRAM (Resistive RAM), and FRAM (Ferroelectric RAM). The unit cells of the memory core 101 may be divided into a plurality of memory regions, for example, a plurality of memory banks (BK0 to BKn−1) (hereinafter referred to as bank).

An address decoder 102 may be coupled with the control circuit 105 and the memory core 101. The address decoder 102 may decode address signals provided by the control circuit 105, and may access the memory core 101 in response to a decoding result.

The data input/output circuit 104 may be coupled to the memory core 101 through a global input/output line GIO. The data input/output circuit 104 may exchange data with an external system or the memory core 101.

The data input/output circuit 104 may perform the write operation with pattern adjustment described above in response to a write command WT, a test mode signal TSTC, and multi-phase signals ICK, QCK, ICKB, and QCKB. The control circuit 105 may be coupled to the memory core 101, the address decoder 102, and the data input/output circuit 104. The control circuit 105 may be provided with command CMD, address ADD, a clock signal WCK, and the like. The control circuit 105 may control a "test" operation and a "normal" operation of the semiconductor apparatus 100.

The normal operation may comprise a read operation, a write operation, and an address processing operation. The control circuit 105 may generate a read command RD, a write command WT, a test mode signal TSTC, and the multi-phase signals ICK, QCK, ICKB, and QCKB, all in response to the command CMD, the address ADD, and the clock signal WCK.

The input/output pad unit 106 may comprise a plurality of electrically-isolated, individual conductive pads 107, (referred to hereinafter as a pad or pads 107) for receiving signals, which include the command CMD signal, an address ADD, and the clock signal WCK. The conductive pads 107 of the pad unit 106 may also be used for inputting and outputting data DQ to and from the semiconductor apparatus 100. Hereinafter, the one or more conductive pads 107 for inputting and outputting data DQ will be referred to as a plurality of data input/output pads. Any one of the plurality of data input/output pads 107 may be used to input data to the apparatus 100, which is provided by the host 11.

Figure 3:
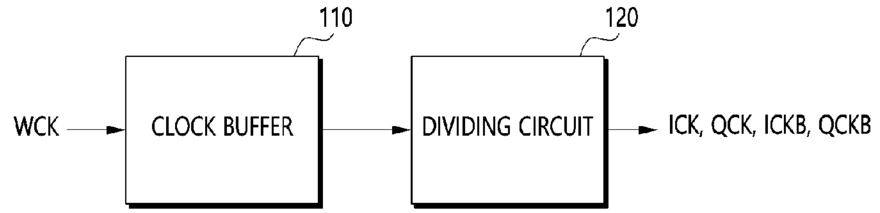
FIG. 3 is a diagram illustrating a configuration for generating multi-phase signals according to an embodiment.

FIG. 3 is a diagram illustrating a configuration for generating multi-phase signals according to an embodiment.

Referring to FIG. 3, the semiconductor apparatus 100 according to an embodiment comprises configurations for generating multi-phase signals ICK, QCK, ICKB, and QCKB, for example, a clock buffer 110 and a dividing circuit 120. The clock buffer 110 and the dividing circuit 120 may be included in any area of an internal organization of the semiconductor apparatus 100, such as, the control circuit 105.

The clock buffer 110 may receive and output an externally provided clock signal, such as a clock signal WCK provided by the host 11. For example, the clock buffer 110 may receive a clock signal provided from the outside of the clock buffer 110, for example, the clock signal WCK provided from the host 11, and output the clock signal WCK to the dividing circuit 120.

Figure 5:
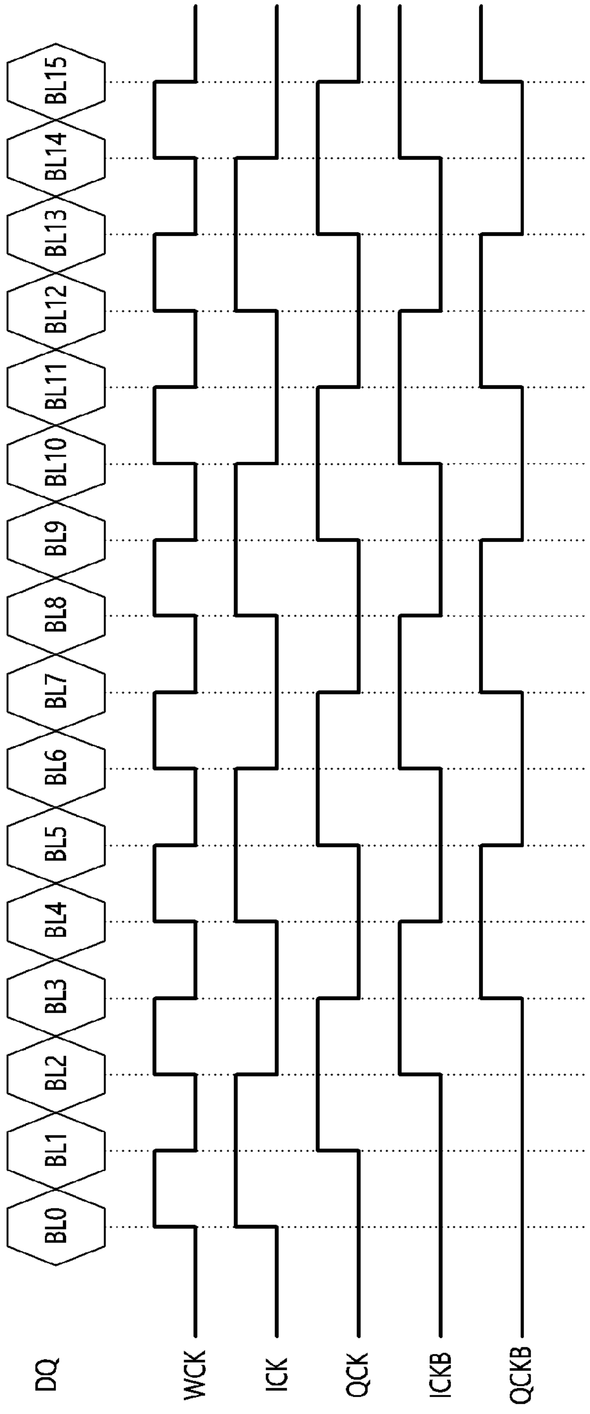
FIG. 5 is a diagram illustrating timing of operation of a data alignment circuit of FIG. 4 according to an embodiment.

The dividing circuit 120 may divide the clock signal WCK output from the clock buffer 110 to generate multi-phase signals ICK, QCK, ICKB, and QCKB. As shown in FIG. 5, the phase of each multi-phase signal differs from the phase of the other multi-phase clock signals. More particularly, the phase of the clock signals ICK, QCK, ICKB, and QCKB may be respectively delayed from the clock signal WCK by 0 degrees, 90 degrees, 180 degrees, and 270 degrees.

Figure 4:
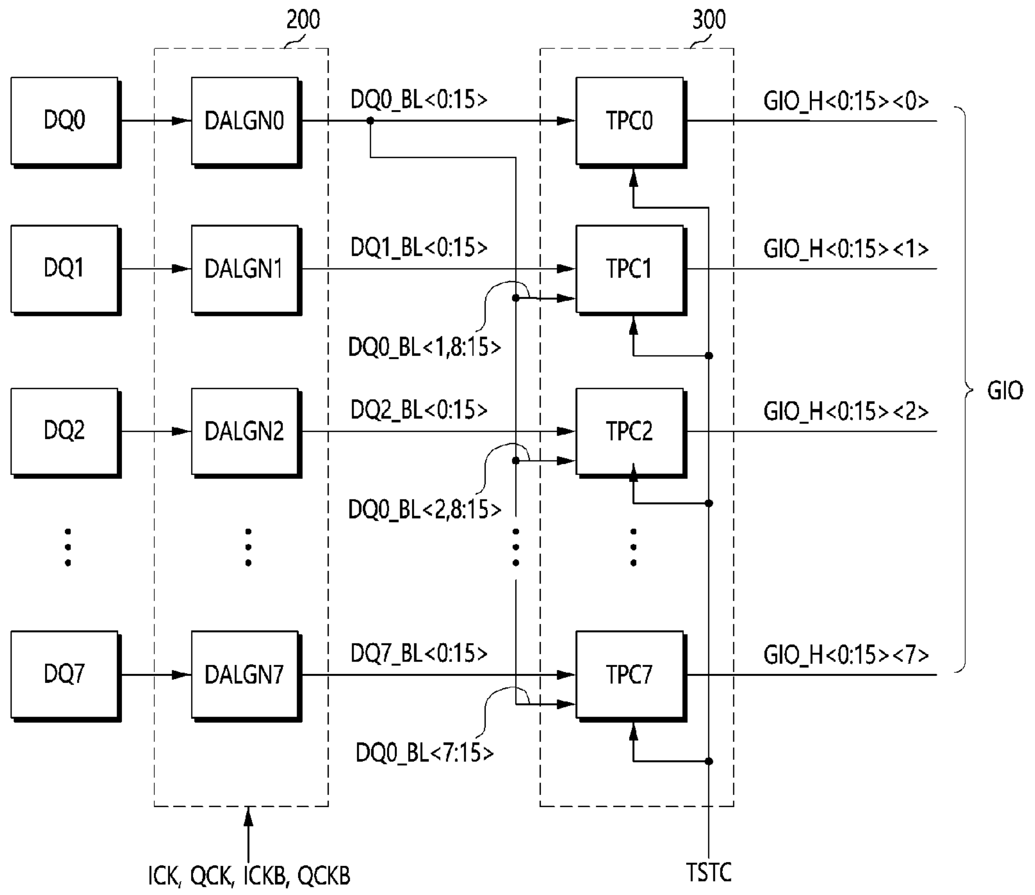
FIG. 4 is a diagram illustrating an internal configuration of a data input/output circuit of FIG. 2 according to an embodiment.
Figure 6:
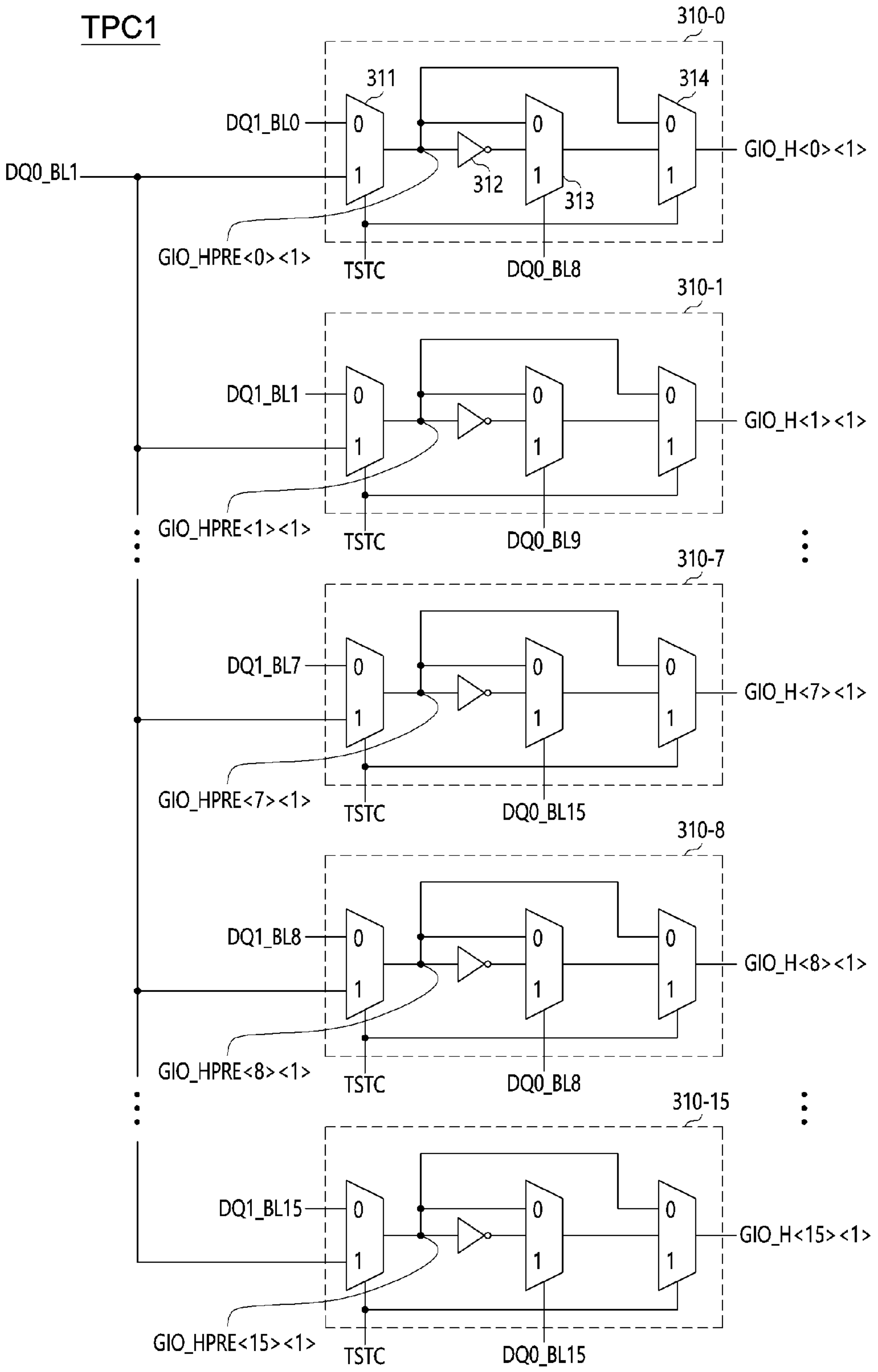
FIG. 6 is a diagram illustrating a configuration of a data pattern control unit of FIG. 4 according to an embodiment.

Referring to FIGS. 4 to 6, circuit configurations related to the write operation with a function for adjusting the pattern of an embodiment will be described.

FIG. 4 is a diagram illustrating an internal configuration of the data input/output circuit 104 of FIG. 2, FIG. 5 is a diagram illustrating an operation timing of a data alignment circuit 200 of FIG. 4, and FIG. 6 is a diagram illustrating a configuration of a data pattern control unit TPC1 of FIG. 4. Here, the data pattern control unit TPC1 will be understood as a data pattern control circuit.

Referring to FIG. 4, the data input/output circuit 104 may include the data alignment circuit 200 and the data pattern control circuit 300.

The data alignment circuit 200 may generate a plurality of alignment data DQ0_BL<0:15> to DQ7_BL<0:15> (hereinafter referred to as DQ<0:7>_BL<0:15>) by aligning data input through one of the data input/output pads DQ0 to DQ7 according to the multi-phase signals ICK, QCK, ICKB, and QCKB. The data alignment circuit 200 may include a plurality of data alignment units DALGN0 to DALGN7.

A first data alignment unit DALGN0 may be coupled to any one of the plurality of data input/output pads DQ0 to DQ7, including for example, a first data input/output pad DQ0. The first data alignment unit DALGN0 may align the data input through the first data input/output pad DQ0 according to the multi-phase signals ICK, QCK, ICKB, AND QCKB to generate alignment data DQ0_BL<0:15> (hereinafter referred to as "first alignment data").

A second data alignment unit DALGN1 may be coupled to any one of the input/output pads DQ0 to DQ7, including for example, the second data input/output pad DQ1 of the plurality of data input/output pads DQ0 to DQ7. The second data alignment unit DALGN1 may align the data input through the second data input/output pad DQ1 according to the multi-phase signals ICK, QCK, ICKB, and QCKB to generate "second alignment data" DQ1_BL<0:15>.

The third data alignment unit DALGN2 may be electrically coupled to any one of the input/output pads DQ0 to DQ7, including for example, he third data input/output pad DQ2 of the plurality of data input/output pads DQ0 to DQ7. The third data alignment unit DALGN2 may align the data input through the third data input/output pad DQ2 according to the multi-phase signals ICK, QCK, ICKB, and QCKB to generate third alignment data DQ2_BL<0:15>.

The fourth to eighth data alignment units DALGN3 to DALGN7 may be coupled to any one of the input/output pads and are respectively coupled with the fourth to eighth data input/output pads DQ3 to DQ7 in the same manner as the first to third data alignment circuits DALGN0 to DALGN2, and the fourth to eighth alignment data DQ<3:7>_BL<0:15> may be generated by aligning data input through the fourth to eighth data input/output pads DQ3 to DQ7 according to the multi-phase clock signals ICK, QCK, ICKB, and QCKB.

As used herein, the word “burst” refers to a sequence of a limited number of binary digits or pulses, which may have a pattern or a set of patterns, the pattern or patterns being related to a device under test. The pattern or patterns that comprise a burst are set up and applied to a device under as a group and are stimuli to the device under test.

The semiconductor apparatus 100 depicted in FIG. 2 may sequentially input, through a data input/output pad DQ during a write operation, a predetermined number of data bits, which comprise a data burst. The number of bits in a data burst corresponding to a predetermined “burst length” BL. For example, as shown in FIG. 5, if the semiconductor apparatus 100 operates with burst length “16” (BL=16), 16 data bits BL0 to BL15 corresponding to burst length “16” may be sequentially input through a data input/output pad DQ.

In a normal mode, 16 burst bits BL0 to BL15 corresponding to burst length ‘16’ may be sequentially input through the data input/output pads DQ0 to DQ7. Therefore, the plurality of data alignment circuits DALGN0 to DALGN7 may generate a corresponding plurality of alignment data DQ<0:7>_BL<0:15> by repeating a process of latching and aligning the burst bits BL0 to BL15 input through the data input/output pads DQ0 to DQ7 according to the multi-phase signals ICK, QCK, ICKB, and QCKB.

In a test mode, 16 bits of burst bits BL0 to BL15 corresponding to the burst length ‘16’ may be input sequentially through the first data input/output pad DQ0 of the plurality of data input/output pads DQ0 to DQ7. Therefore, the first data alignment unit DALGN0 may generate the first alignment data DQ0_BL<0:15> by repeating a process of latching and aligning the burst bits BL0 to BL15 sequentially input through the first data input/output pad DQ0 according to the multi-phase signals ICK, QCK, ICKB, and QCKB.

Referring again to FIG. 4, the data pattern control circuit 300 may receive the plurality of alignment data DQ<0:7>_BL<0:15> and the test mode signal TSTC and generate a plurality of write data GIO_H<0:15><0:7> and transmit the write data GIO_H<0:15><0:7> to corresponding global input/output line GIO.

In response to activation of the test mode signal TSTC, for example, in the write operation of the test mode, the data pattern control circuit 300 may copy burst bits corresponding to the test source data, i.e., burst bits in order 0th to Mth (where, M is 7) of the first alignment data DQ0_BL<0:15>, one bit at a time, to a plurality of input paths electrically coupled to the plurality of data input/output pads DQ0 to DQ7. For example, the plurality of copied data may refer to a plurality of preliminary data (GIO_HPRE<0:15><0:7>) in FIG. 6. Then, the data pattern control circuit 300 may generate the plurality of write data GIO_H<0:15><0:7> by inverting a pattern of the copied data, for example, burst bits of the copied data according to the burst bits corresponding to the pattern control signal, that is, burst bits in order (M+1)th to Nth (where, M is 7 and N is 15) of the first alignment data DQ0_BL<0:15>. In response to de-activation of the test mode signal TSTC, for example, in the write operation of the normal mode, the data pattern control circuit 300 may output the plurality of alignment data DQ<0:7>_BL<0:15> as the plurality of write data GIO_H<0:15><0:7> without copying and inverting of the alignment data.

The data pattern control circuit 300 may comprise a plurality of data pattern control units also referred to as data pattern control circuits, TPC0 to TPC7 may have the same circuit configuration as each other.

The first pattern control unit TPC0 may receive the first alignment data DQ0_BL<0:15> and the test mode signal TSTC and output the first write data GIO_H<0:15><0> to the global input/output line GIO. The first pattern control unit TPC0 may copy a 0th burst bit DQ0_BL0 of the first alignment data DQ0_BL<0:15> in response to activation of the test mode signal TSTC, and invert the pattern (for example, invert the burst bit) of the copied data according to the burst bits DQ0_BL<8:15> of the first alignment data DQ0_BL<0:15> to generate the first write data GIO_H<0:15><0>. The first pattern control unit TPC0 may output the first alignment data DQ0_BL<0:15> as the first write data GIO_H<0:15><0> without inverting the first alignment data DQ0_BL<0:15> in response to de-activation of the test mode signal TSTC.

The second pattern control unit TPC1 may receive the second alignment data DQ1_BL<0:15>, bits DQ0_BL<1, 8:15> of the first alignment data DQ0_BL<0:15>, and the test mode signal TSTC as input, and output the second write data GIO_H<0:15><1> to the global input/output line GIO. The second pattern control unit TPC1 may copy a first burst bit DQ0_BL1 of the first alignment data DQ0_BL<0:15> in response to activation of the test mode signal TSTC, and invert a pattern (for example, burst bits) of the copied data according to the burst bits DQ0_BL<8:15> of the first alignment data DQ0_BL<0:15> to generate the second write data GIO_H<0:15><1>. The second pattern control unit TPC1 may output the second alignment data DQ1_BL<0:15> as the second write data GIO_H<0:15><1> without inverting the second alignment data DQ1_BL<0:15> in response to de-activation of the test mode signal TSTC.

The third pattern control unit TPC2 may receive the third alignment data DQ2_BL<0:15>, bits DQ0_BL<2, 8:15> of the first alignment data DQ0_BL<0:15>, and the test mode signal TSTC as input, and output the third write data GIO_H<0:15><2> to the global input/output line GIO. The third pattern control unit TPC2 may copy a second burst bit DQ0_BL2 of the first alignment data DQ0_BL<0:15> in response to activation of the test mode signal TSTC, and invert a pattern (for example, burst bits) of the copied data according to the burst bits DQ0_BL<8:15> of the first alignment data DQ0_BL<0:15> to generate the third write data GIO_H<0:15><2>. The third pattern control unit TPC2 may output the third alignment data DQ2_BL<0:15> as the third write data GIO_H<0:15><2> without inverting the third alignment data DQ2_BL<0:15> in response to de-activation of the test mode signal TSTC.

The fourth pattern control unit TPC3 is not shown, but may receive the fourth alignment data DQ3_BL<0:15>, bits DQ0_BL<3, 8:15> of the first alignment data DQ0_BL<0:15>, and the test mode signal TSTC, and output the fourth write data GIO_H<0:15><3> to the global input/output line GIO. The fourth pattern control unit TPC3 may copy a third burst bit DQ0_BL3 of the first alignment data DQ0_BL<0:15> in response to activation of the test mode signal TSTC, and invert a pattern (for example, burst bits) of the copied data according to the burst bits DQ0_BL<8:15> of the first alignment data DQ0_BL<0:15> to generate the fourth write data GIO_H<0:15><3>. The fourth pattern control unit TPC3 may output the fourth alignment data DQ3_BL<0:15> as the fourth write data GIO_H<0:15><3> without inverting the fourth alignment data DQ3_BL<0:15> in response to de-activation of the test mode signal TSTC.

The fifth pattern control unit TPC4 is not shown, but may receive the fifth alignment data DQ4_BL<0:15>, bits DQ0_BL<4, 8:15> of the first alignment data DQ0_BL<0:15>, and the test mode signal TSTC, and output the fifth write data GIO_H<0:15><4> to the global input/output line GIO. The fifth pattern control unit TPC4 may copy a fourth burst bit DQ0_BL4 of the first alignment data DQ0_BL<0:15> in response to activation of the test mode signal TSTC, and invert a pattern (for example, burst bits) of the copied data according to the burst bits DQ0_BL<8:15> of the first alignment data DQ0_BL<0:15> to generate the fifth write data GIO_H<0:15><4>. The fifth pattern control unit TPC4 may output the fifth alignment data DQ4_BL<0:15> as the fifth write data GIO_H<0:15><4> without inverting the fifth alignment data DQ4_BL<0:15> in response to de-activation of the test mode signal TSTC.

The sixth pattern control unit TPC5 is not shown, but may receive the sixth alignment data DQ5_BL<0:15>, bits DQ0_BL<5, 8:15> of the first alignment data DQ0_BL<0:15>, and the test mode signal TSTC, and output the sixth write data GIO_H<0:15><5> to the global input/output line GIO. The sixth pattern control unit TPC5 may copy a fifth burst bit DQ0_BL5 of the first alignment data DQ0_BL<0:15> in response to activation of the test mode signal TSTC, and invert a pattern (for example, burst bits) of the copied data according to the burst bits DQ0_BL<8:15> of the first alignment data DQ0_BL<0:15> to generate the sixth write data GIO_H<0:15><5>. The sixth pattern control unit TPC5 may output the sixth alignment data DQ5_BL<0:15> as the sixth write data GIO_H<0:15><5> without inverting the sixth alignment data DQ5_BL<0:15> in response to de-activation of the test mode signal TSTC.

The seventh pattern control unit TPC6 is not shown, but may receive the seventh alignment data DQ6_BL<0:15>, bits DQ0_BL<6, 8:15> of the first alignment data DQ0_BL<0:15>, and the test mode signal TSTC, and output the seventh write data GIO_H<0:15><6> to the global input/output line GIO. The seventh pattern control unit TPC6 may copy a sixth burst bit DQ0_BL6 of the first alignment data DQ0_BL<0:15> in response to activation of the test mode signal TSTC, and may invert a pattern (for example, burst bits) of the copied data according to the burst bits DQ0_BL<8:15> of the first alignment data DQ0_BL<0:15> to generate the seventh write data GIO_H<0:15><6>. The seventh pattern control unit TPC6 may output the seventh alignment data DQ6_BL<0:15> as the seventh write data GIO_H<0:15><6> without inverting the seventh alignment data DQ6_BL<0:15> in response to de-activation of the test mode signal TSTC.

The eighth pattern control unit TPC7 may receive the eighth alignment data DQ7_BL<0:15>, bits DQ0_BL<7:15> of the first alignment data DQ0_BL<0:15>, and the test mode signal TSTC as input, and output the eighth write data GIO_H<0:15><7> to the global input/output line GIO. The eighth pattern control unit TPC7 may copy a seventh burst bit DQ0_BL7 of the first alignment data DQ0_BL<0:15> in response to activation of the test mode signal TSTC, and may invert a pattern (for example, burst bits) of the copied data according to the burst bits DQ0_BL<8:15> of the first alignment data DQ0_BL<0:15> to generate the eighth write data GIO_H<0:15><7>. The eighth pattern control unit TPC7 may output the eighth alignment data DQ7_BL<0:15> as the eighth write data GIO_H<0:15><7> without inverting the eighth alignment data DQ7_BL<0:15> in response to de-activation of the test mode signal TSTC.

Referring now to FIG. 6, a detailed configuration of the plurality of data pattern control units TPC0 to TPC7 will be described. Because the plurality of data pattern control units TPC0 to TPC7 may have the same circuit configuration, the configuration of the second data pattern control unit TPC1 will be described using one of the plurality of data pattern control units TPC0 to TPC7 as an example. The second data pattern control unit TPC1 may include a plurality of subunits 310-0 to 310-15 corresponding to the burst bits of the corresponding alignment data, that is, the second alignment data DQ1_BL<0:15>. The plurality of subunits 310-0 to 310-15 may have the same circuit configuration as each other.

Subunit 310-0 may comprise a first multiplexer 311, a logic gate 312, a second multiplexer 313, and a third multiplexer 314.

The first multiplexer 311 may output either a burst bit DQ1_BL0 of the second alignment data DQ1_BL<0:15> and burst bit DQ0_BL1 of the first alignment data DQ0_BL<0:15> responsive to the test mode signal TSTC. The first multiplexer 311 may output the burst bit DQ1_BL0 when the test mode signal TSTC is inactivated to a low level in the normal mode, and may output the burst bit DQ0_BL1 when the test mode signal TSTC is activated to a high level in the test mode.

Logic gate 312 may invert an output of the first multiplexer 311 and output it to a second multiplexer 313. The logic gate 312 may have an inverter.

The second multiplexer 313 may output the output of the first multiplexer 311, inverted by the logic gate 312 according to a burst bit DQ0_BL8 of one of the burst bits DQ0_BL<8:15> of the first alignment data DQ0_BL<0:15>. As shown in FIG. 6, if the burst bit DQ0_BL8 is a low level, the second multiplexer 313 may output the output of the first multiplexer 311, around the logic gate 312 such that the second multiplexer 313 outputs the non-inverted alignment data. The second multiplexer 313 may output the output of the logic gate 312, i.e., inverted level of the alignment data, if the burst bit DQ0_BL8 is high level.

The third multiplexer 314 may output either the output of the first multiplexer 311 or the output of the second multiplexer 313 responsive to the test mode signal TSTC. The third multiplexer 314 may thus output the output of the first multiplexer 311, i.e, burst bit DQ1_BL0, as one bit GIO_H<0><1> of the second write data GIO_H<0:15><1> when the test mode signal TSTC is de-activated to a low level in the normal mode. The third multiplexer 314 may output the second multiplexer 313, i.e., either the original level or the inverted level of the burst bit DQ0_BL0 as one bit GIO_H<0><1> of the second write data GIO_H<0:15><1> when the test mode signal TSTC is activated to a high level in the test mode.

The second multiplexers 313 of subunits 310-0 to 310-7 receive the 8th to 15th burst bits DQ0_BL<8:15> of the first alignment data DQ0_BL<0:15> by a bit as the pattern control signal. Similarly, the second multiplexers 313 of subunits 310-8 to 310-15 may also receive the 8th to 15th burst bits DQ0_BL<8:15> of the first alignment data DQ0_BL<0:15> by the bit as the pattern control signal. As a result, the plurality of data pattern control units TPC0 to TPC7 may output the plurality of alignment data of the data input through the data input/output pads DQ assigned thereto as the plurality of write data in the normal mode. For example, the plurality of data pattern control units TPC0 to TPC7 may output the plurality of alignment data DQ<0:7>_BL<0:15>, in which the plurality of data input through the data input/output pads DQ<0:7> are aligned according to the multi-phase signals ICK, QCK, ICKB, and QCKB, as the write data GIO_H<0:15><0:7> in the write operation of the normal mode. In the test mode, the plurality of data pattern control units TPC0 to TPC7, regardless of the data input/output pads DQ<0:7> assigned thereto, copy the 0th to 7th burst bits DQ0_BL<0:7> of the first alignment data DQ0_BL<0:15>, and then invert the bits and output inverting results as write data according to the 8th to 15th burst bits DQ0_BL<8:15> of the first alignment data DQ0_BL<0:15>. For example, in the write operation of the test mode, the plurality of data pattern control units TPC0 to TPC7 may copy, the test source data, for example, the 0th to 7th burst bits DQ0_BL<0:7> of the first alignment data DQ0_BL<0:15> corresponding to the first input/output pad DQ0 among the data input/output pads DQ<0:7>, respectively, to generate the plurality of preliminary write data GIO_HPRE<0:15><0:7> based on the test mode signal TSTC. Then, the plurality of data pattern control units TPC0 to TPC7 may invert the plurality of copied data as the plurality of preliminary write data based on the 8th to 15th burst bits DQ0_BL<8:15> of the first alignment data DQ0_BL<0:15> as the pattern control signal to generate the plurality of write data. The plurality of data pattern control units TPC0 to TPC7 may output the plurality of write data as test pattern according to the test mode signal TSTC.

Figure 7:
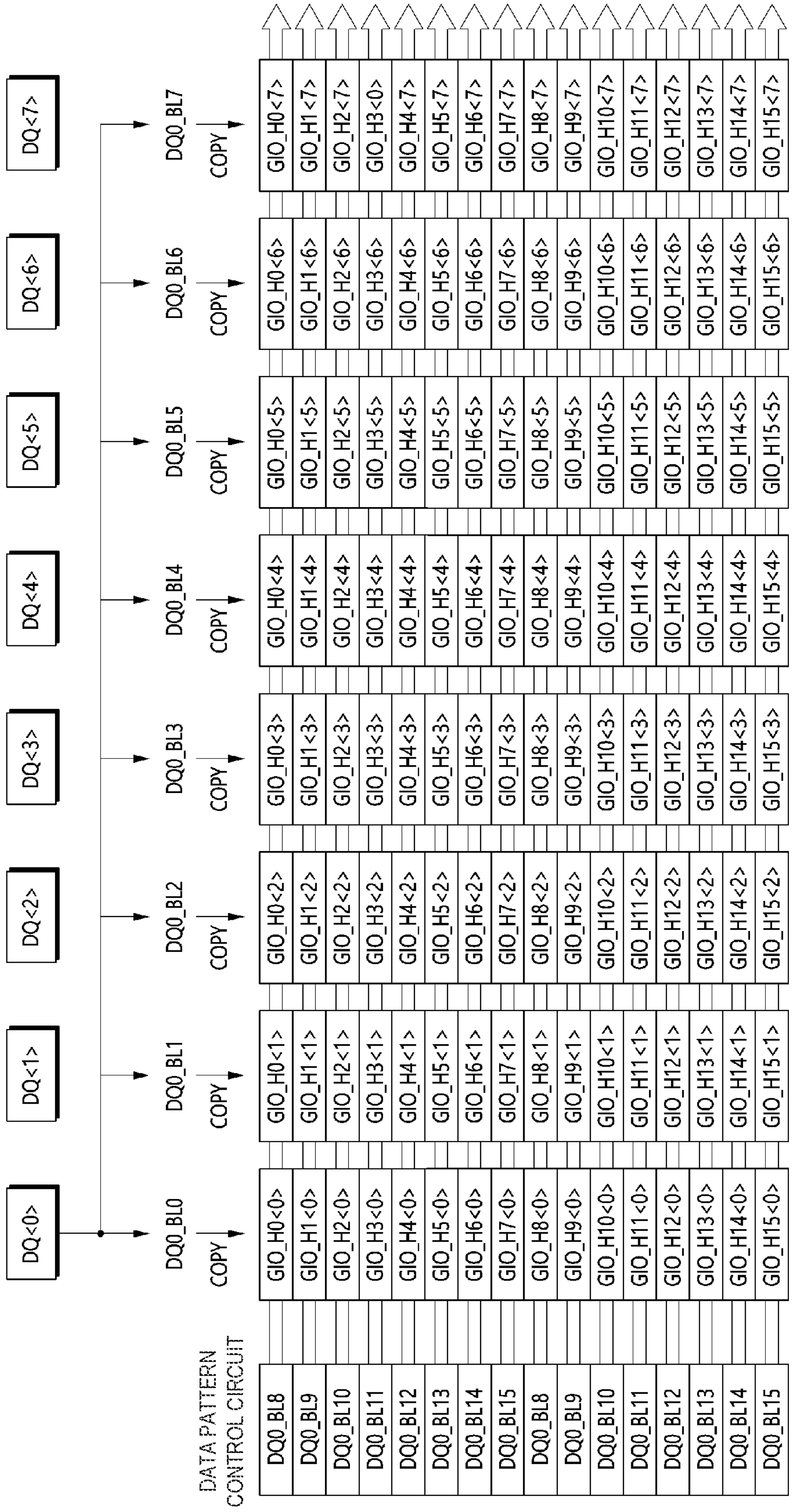
FIG. 7 is a diagram illustrating a data write method according to an embodiment.

FIG. 7 is a diagram illustrating a data write method in the test mode according to an embodiment.

Hereinafter, the data writing method according to an embodiment will be described with reference to FIG. 7.

In the test mode, the host 11 may sequentially input 16 burst bits BL0 to BL15 corresponding to burst length "16" to the DUT, for example, the semiconductor apparatus 100 through the plurality of data input/output pads DQ0 to DQ7, respectively. The host 11 may include the test source data in BL0 to BL7 of the burst bits BL0 to BL15, and may include the pattern control signal for determining whether the test source data is inverted in BL8 to BL15. For example, the 16 burst bits BL0 to BL15 input through each of the plurality of data input/output pads DQ0 to DQ7 may be provided to generate the plurality of write data.

The first data alignment unit DALGN0 may generate the first alignment data DQ0_BL<0:15> by repeating the process of latching and aligning the burst bits BL0 to BL15 sequentially input through the first data input/output pad DQ0 according to the multi-phase signals ICK, QCK, ICKB, and QCKB. Among the first alignment data DQ0_BL<0:15>, DQ0_BL<0:7> may correspond to the test source data, and DQ0_BL<8:15> may correspond to the pattern control signal. In exemplary embodiments, in the test mode, among the 16 burst bits BL0 to BL15 of the first alignment data, 8 burst bits, for example, 0th to 7th burst bits BL0 to BL7, which are provided to the first to eighth pattern control units TPC0 to TPC7 of the test mode control circuit 300, respectively, may refer to the test source data for generating the write data. The remaining 8 burst bits, for example, 8th to 15th burst bits BL8 to BL15, which are provided to the first to eighth pattern control units TPC0 to TPC7 of the test mode control circuit 300, respectively, may refer to the pattern control signal for determining whether or not to invert the test source data.

The data pattern control circuit 300 may copy the test source data, i.e., DQ0_BL<0:7>, bit by bit to the plurality of input paths, for example, the pattern control units TPC0 to TPC7, electrically coupled to the plurality of data input/output pads DQ0 to DQ7. As shown in FIGS. 4 and 6, the data pattern control circuit 300 may copy DQ0_BL<0> to an input path, for example, the plurality of sub units 310-0 to 310-15 of the first pattern control unit TCP0, electrically coupled to the first data input/output pad DQ0, copy DQ0_BL<1> to an input path, for example, the plurality of sub units 310-0 to 310-15 of the second pattern control unit TCP1 electrically coupled to the second data input/output pad DQ1, copy DQ0_BL<2> to an input path, for example, the plurality of sub units 310-0 to 310-15 of the third pattern control unit TCP2, electrically coupled to the third data input/output pad DQ2, copy DQ0_BL<3> to an input path, for example, the plurality of sub units 310-0 to 310-15 of the fourth pattern control unit TCP3, electrically coupled to the fourth data input/output pad DQ3, copy DQ0_BL<4> to an input path, for example, the plurality of sub units 310-0 to 310-15 of the fifth pattern control unit TCP4, electrically coupled to the fifth data input/output pad DQ4, copy DQ0_BL<5> to an input path, for example, the plurality of sub units 310-0 to 310-15 of the sixth pattern control unit TCP5, electrically coupled to the sixth data input/output pad DQ5, copy DQ0_BL<6> to an input path, for example, the plurality of sub units 310-0 to 310-15 of the seventh pattern control unit TCP6, electrically coupled to the seventh data input/output pad DQ6, and copy DQ0_BL<7> to an input path, for example, the plurality of sub units 310-0 to 310-15 of the eighth pattern control unit TCP7, coupled to the eighth data input/output pad DQ7.

The data pattern control circuit 300 may generate the plurality of write data GIO_H<0:15><0:7> by inverting the pattern of the copied data according to the pattern control signal, i.e., DQ0_BL<8:15>. For example, the data pattern control circuit 300 may copy DQ0_BL<0:7> of the first alignment data DQ0_BL<0:15> to generate the preliminary write data GIO_HPRE<0:15><0:7> according to the mode signal TSTC, invert the copied data DQ0_BL<0:7>, which are the preliminary write data GIO_HPRE<0:15><0:7>, according to the pattern control signal DQ0_BL<8:15> to generate the write data GIO_H<0:15><0:7>, and output the generated write data GIO_H<0:15><0:7> to the global input/output line GIO according to the mode signal TSTC.

Referring to FIG. 6, for example, assuming that DQ0_BL<0> is a high level, the copied data as the first preliminary write data, which are provided to the input path electrically coupled to the first data input/output pad DQ0, may be '1111111111111111.' Assuming DQ0_BL<8:15> is '11110000', the first write data GIO_H<0:15><0> could be '0000111100001111'.

For another example, assuming DQ0_BL<0> is low level, the copied data as the first preliminary write data, which are provided to the input path associated with the first data input/output pad DQ0 may be '0000000000000000'. Assuming DQ0_BL<8:15> is '11110000', the first write data GIO_H<0:15><0> may be '1111000011110000'.

As another example, if DQ0_BL<1> is high level, the copied data as the second preliminary write data, which are provided to the input path electrically coupled to the second data input/output pad DQ1 may be '1111111111111111'. If DQ0_BL<8:15> is '10001000', the second write data GIO_H<0:15><1> may be '0111011101110111'.

The write data GIO_H<0:15><0:7> generated in the above manner may be written to the memory core 101, as the test pattern, through the global input/output line GIO, and the test may be performed accordingly.

In addition to the example described above, a wide variety of test patterns may be implemented by adjusting the value of the test source data and the pattern control signal. Thus, an embodiment may write a desired test pattern with only one data input without additional procedures.

On the other hand, unlike FIG. 7, in the writing operation according to the normal mode, 16 bits of burst bits BL0 to BL15 corresponding to the burst length "16" may be sequentially input through the plurality of data input/output pads DQ0 to DQ7, respectively. Therefore, the plurality of data alignment circuits DALGN0 to DALGN7 may generate the plurality of alignment data DQ<0:7>_BL<0:15> by repeating the process of latching and aligning the burst bits BL0 to BL15 respectively input through the plurality of data input/output pads DQ0 to DQ7 according to the multi-phase signals ICK, QCK, ICKB, and QCKB.

The data pattern control circuit 300 may output the plurality of alignment data DQ<0:7>_BL<0:15> as a plurality of write data GIO_H<0:15><0:7> without inverting in response to de-activation of the test mode signal TSTC.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A semiconductor apparatus comprising:

a data alignment circuit configured to align data input through a plurality of data input/output pads, and to generate a plurality of alignment data; and a data pattern control circuit configured to generate preliminary write data by copying bits of a first alignment data to input paths of the data pattern control circuit electrically coupled to corresponding ones of the plurality of data input/output pads, the data pattern control circuit being further configured to change a pattern of preliminary write data according to remaining bits of the first alignment data.

2. The semiconductor apparatus of claim 1, wherein the data alignment circuit is configured to output alignment data among the plurality of alignment data, which is corresponding to a first data input/output pad of the plurality of data input/output pads, as the first alignment data.

3. The semiconductor apparatus of claim 1, wherein the data pattern control circuit is configured to generate the write data by inverting data bits of each of the preliminary write data according to remaining bits of the first alignment data in response to activation of a test mode signal.

4. The semiconductor apparatus of claim 1, wherein the data pattern control circuit is configured to generate the plurality of write data by inverting each of the plurality of preliminary write data according to the remaining bits of the first alignment data.

5. The semiconductor apparatus of claim 3, wherein the data pattern control circuit is configured to output the plurality of alignment data as the write data without changing the pattern in response to de-activation of the test mode signal.

6. A semiconductor apparatus comprising:

a data alignment circuit configured to align data input through a plurality of data input/output pads, and to generate a plurality of alignment data; and a plurality of data pattern control units configured to generate a plurality of preliminary write data by copying, in response to activation of a test mode signal, each burst bit in order 0th to Mth (where, M is a natural number) of a first alignment data among the plurality of alignment data to a corresponding one of a plurality of input paths of the data pattern control units coupled to the plurality of data input/output pads one bit at a time, and configured to invert a pattern of the plurality of preliminary write data according to burst bits in order (M+1)th to Nth (where, N is a natural number) of the first alignment data to generate a plurality of write data.

7. The semiconductor apparatus of claim 6, wherein each of the plurality of data pattern control units is configured to transmit alignment data to an input path of the plurality of input paths in response to de-activation of the test mode signal.

8. The semiconductor apparatus of claim 6, wherein each of the plurality of data pattern control units comprises:

a first multiplexer configured to output, according to the test mode signal, one of a burst bit of alignment data corresponding thereto among the plurality of alignment data and a burst bit of the first alignment data, a logic gate configured to invert and output an output of the first multiplexer, a second multiplexer configured to output one of the output of the first multiplexer and an output of the logic gate according to one of the burst bits in order (M+1)th to Nth of the first alignment data; and a third multiplexer configured to output one of the output of the first multiplexer and an output of the second multiplexer according to the test mode signal.

9. A semiconductor system comprising:

a host configured to output a first data; and a semiconductor apparatus configured to receive the first data through a first data input/output pad of a plurality of data input/output pads to generate a first alignment data including a test source data and a pattern control signal for determining whether to invert the test source data, generate a plurality of write data based on the first alignment data and write the plurality of write data in a memory region, and adjust a pattern of the plurality of write data during generation of the plurality of write data according to the pattern control signal when a test mode signal is activated.

10. The semiconductor system of claim 9, wherein the semiconductor apparatus comprises:

an input/output pad unit including the plurality of data input/output pads, a memory core including the memory region, a data alignment circuit configured to align data including the first data input through each of the plurality of data input/output pads and generate a plurality of alignment data including the first alignment data; and a plurality of data pattern control units configured to generate a plurality of preliminary write data by copying, in response to activation of the test mode signal, burst bits in order 0th to Mth (where, M is a natural number) corresponding to the test source data of the first alignment data to a plurality of input paths by one bit, invert the plurality of preliminary write data according to burst bits in order (M+1)th to Nth (where, N is a natural number) corresponding to the pattern control signal of the first alignment data to generate the plurality of write data, and write the plurality of write data to the memory core.

11. The semiconductor system of claim 10, wherein the input/output pad unit further comprises a plurality of pads configured to receive commands, addresses, and clock signals, and configured to transmit and receive error detection codes.

12. The semiconductor system of claim 10, wherein the data alignment circuit is configured to generate the plurality of alignment data according to multi-phase signals.

13. The semiconductor system of claim 10, wherein each of the plurality of data pattern control units is configured to write alignment data corresponding to thereto among the plurality of alignment data to the memory core as it is in response to de-activation of the test mode signal.

14. The semiconductor system of claim 10, wherein each of the plurality of data pattern control units comprises:

a first multiplexer configured to output, according to the test mode signal, one of burst bits of alignment data corresponding thereto among the plurality of alignment data and a burst bit of the first alignment data, a logic gate configured to invert and output an output of the first multiplexer, a second multiplexer configured to output one of the output of the first multiplexer and an output of the logic gate according to one of the burst bits in order (M+1)th to Nth of the first alignment data; and a third multiplexer configured to output one of the output of the first multiplexer and an output of the second multiplexer according to the test mode signal.

15. The semiconductor system of claim 12, further comprising:

a clock buffer configured to receive a clock signal, and a dividing circuit configured to divide an output of the clock buffer to generate the multi-phase signals.

* * * * *